(12) United States Patent
Tsai et al.

(10) Patent No.: US 10,153,199 B2
(45) Date of Patent: Dec. 11, 2018

(54) SEMICONDUCTOR DEVICE AND FABRICATION METHOD THEREFOR

(71) Applicant: TAIWAN SEMICONDUCTOR MANUFACTURING COMPANY, LTD., Hsinchu (TW)

(72) Inventors: Chun Hsiung Tsai, Xinpu Township (TW); Kei-Wei Chen, Tainan (TW); Lai-Wan Chong, Kaohsiung (TW); Tsan-Chun Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 67 days.

(21) Appl. No.: 15/167,111

(22) Filed: May 27, 2016

(65) Prior Publication Data
US 2017/0278743 A1   Sep. 28, 2017

Related U.S. Application Data

(60) Provisional application No. 62/313,656, filed on Mar. 25, 2016.

(51) Int. Cl.
*H01L 21/768* (2006.01)
*H01L 23/535* (2006.01)
(Continued)

(52) U.S. Cl.
CPC .. *H01L 21/76814* (2013.01); *H01L 21/76805* (2013.01); *H01L 21/76829* (2013.01); *H01L 21/76895* (2013.01); *H01L 21/76897* (2013.01); *H01L 23/485* (2013.01); *H01L 23/535* (2013.01); *H01L 29/0847* (2013.01); *H01L 29/161* (2013.01); *H01L 29/165* (2013.01);
(Continued)

(58) Field of Classification Search
None
See application file for complete search history.

(56) References Cited

U.S. PATENT DOCUMENTS

2012/0175707 A1* 7/2012 Jung ............... H01L 21/28518
                                                          257/368
2012/0225558 A1* 9/2012 Chang ............. H01L 21/02063
                                                          438/694

(Continued)

OTHER PUBLICATIONS

Kanarik et al. (Overview of atomic layer etching in the semiconductor industry, Journal of Vacuum Science & Technology A: Vacuum, Surfaces, and Films 33, 020802 (2015), Mar. 5, 2015).*

*Primary Examiner* — Matthew Reames
*Assistant Examiner* — Steven B Gauthier
(74) *Attorney, Agent, or Firm* — Hauptman Ham, LLP (57) ABSTRACT

A method of fabricating a semiconductor device. The method includes forming source/drain features in a substrate on opposite sides of a gate structure, forming an etch stop layer over the source/drain features, and depositing a dielectric layer on the etch stop layer. The method further includes performing a first atomic layer etching (ALE) process having a first operating parameter value on the dielectric layer to form a first part of an opening, and performing a second ALE process having a second operating parameter value to extend the opening to expose the source/drain features. The first operating parameter value is different from the second operating parameter value.

20 Claims, 7 Drawing Sheets

(51) Int. Cl.
*H01L 29/08* (2006.01)
*H01L 29/16* (2006.01)
*H01L 29/161* (2006.01)
*H01L 29/165* (2006.01)
*H01L 29/66* (2006.01)
*H01L 29/78* (2006.01)
*H01L 23/485* (2006.01)

(52) U.S. Cl.
CPC .... *H01L 29/1608* (2013.01); *H01L 29/66636* (2013.01); *H01L 29/66795* (2013.01); *H01L 29/7848* (2013.01); *H01L 29/7851* (2013.01); *H01L 21/76816* (2013.01)

(56) References Cited

U.S. PATENT DOCUMENTS

| | | | | |
|---|---|---|---|---|
| 2013/0037890 A1* | 2/2013 | Tseng | ................ | H01L 27/14614 257/411 |
| 2013/0092988 A1* | 4/2013 | Uozumi | ................ | H01L 23/535 257/288 |
| 2013/0248999 A1* | 9/2013 | Glass | ................ | H01L 29/36 257/335 |
| 2014/0134818 A1* | 5/2014 | Cheng | ................ | H01L 29/66636 438/300 |

\* cited by examiner

SEMICONDUCTOR DEVICE AND FABRICATION METHOD THEREFOR

BACKGROUND

Atomic layer etching (ALE) is an etch process for removing a thin layer of material during each cycle of the ALE process. A thickness of the removed layer is typically approximately one to several atoms thick. An etchant species is disposed over a top layer of a surface of a material to be etched. The etchant species bonds with surface atoms of the material to be etched. A charged ion bombardment is then guided to the etchant layer in order to remove the etchant layer and the atoms bonded to the etchant layer. With a controlled beam bombardment in conjunction with the etchant species, a designed atomic scale thickness is removed by each cycle of the ALE process. ALE processes are repeated until a desired amount of material is removed from the material to be etched.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

In some approaches for forming contact or via openings, residue remains in the opening after completion of an etch process to form the openings. The residue blocks a portion of a conductive feature exposed by the opening. Interconnections (also referred to as interconnects) formed through contact/via structures and electrically connected to the conductive feature exhibit an increased resistance to the flow of electric current due to the reduced contact area between the interconnects and the conductive feature. A combination of ALE processes having different operating parameters is able to decrease an amount of residue remaining after forming the opening. A first ALE process is used to expose a portion of an underlying conductive feature, then a subsequent ALE process helps to remove residue remaining after the first ALE process. The decreased amount of residue reduces contact resistance between interconnects and the conductive feature in comparison with other approaches.

Figure 1A:
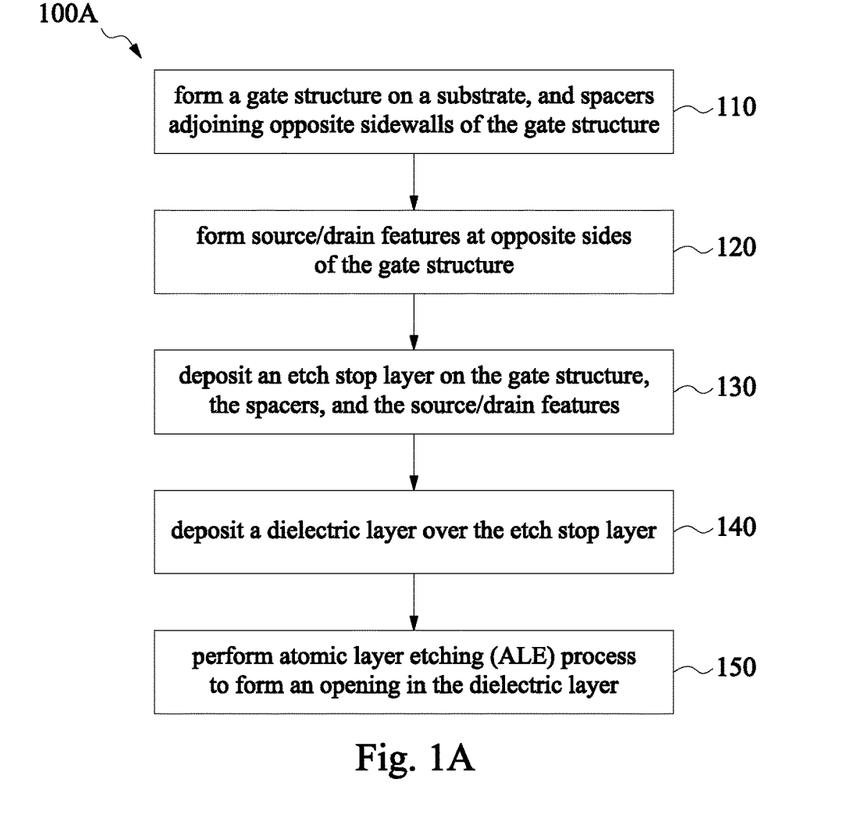
FIG. 1A is a flowchart of a method of fabricating a semiconductor device including forming an opening in accordance with one or more embodiments.

FIG. 1A is a flowchart of a method 100A of fabricating a semiconductor device including forming an opening according to one or more embodiments. In some embodiments, the semiconductor device is a field effect transistor (FET). In some embodiments, the opening exposes a source or drain feature of the semiconductor device and is called a contact opening. In some embodiments, the term field effect transistor refers to a fin field effect transistor (FinFET). In some embodiments, the term FET refers to a planar metal-oxide-semiconductor field effect transistor (MOSFET). Other transistor structures and analogous structures, such as a tri-gate field effect transistor, a gate-all-around field effect transistor, a nanowire or tunneling field effect transistor, are within the contemplated scope of this description. The FET is included in a complimentary MOS (CMOS) integrated circuit (IC), memory cells or other structures in some embodiments. In at least one embodiment, a pitch of the FET is less than 70 nanometers (nm). FIGS. 2A to 2H are schematic cross-sectional views of the semiconductor device at various stages of fabrication according to one or more embodiments.

Method 100A includes operation 110 in which gate structure and spacers are formed on a substrate. The gate structure is on a top surface of the substrate. The spacers adjoin opposite sidewalls of the gate structure. In some embodiments, the gate structure includes a dummy gate structure. In some embodiments, the gate structure includes a gate dielectric layer. In some embodiments, the gate structure includes a gate electrode layer. In some embodiments, the spacers include silicon oxide, silicon nitride or another suitable material. In some embodiments, the spacers include an oxide-nitride-oxide (ONO) structure.

Figure 2A:
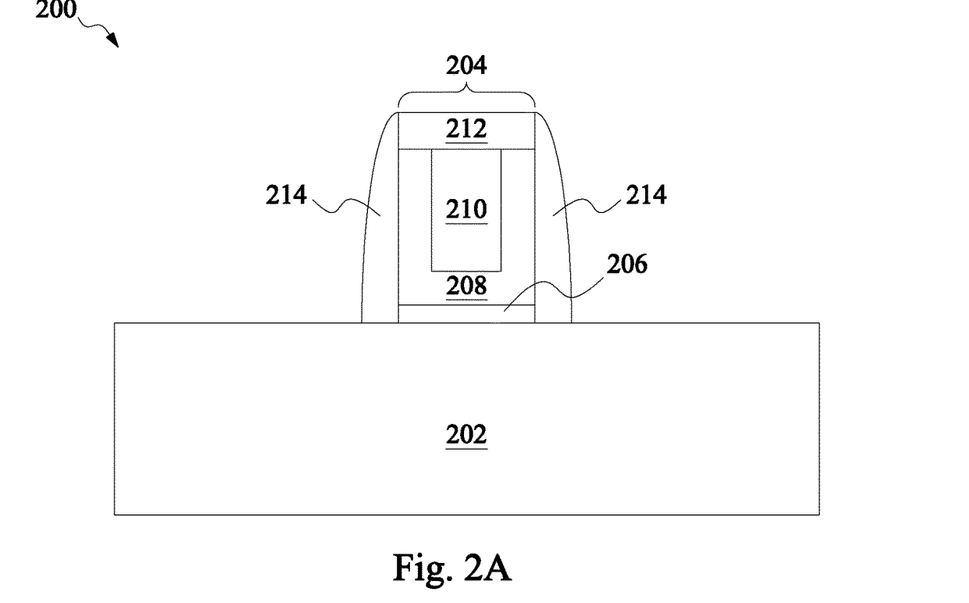
FIGS. 2A-2H are cross-sectional views of a semiconductor device having a contact opening at various stages of production in accordance with one or more embodiments.

FIG. 2A is a cross-sectional view of semiconductor device 200 following operation 110 in accordance with one or more embodiments. Semiconductor device 200 includes a substrate 202. A gate structure 204 is over substrate 202. Gate structure 204 includes a first dielectric portion 206 over substrate 202. In some instances, first dielectric portion 206 is called an interfacial layer. A second dielectric portion 208 is over a top surface of first dielectric portion 206. In some instances, second dielectric portion 208 is called a gate dielectric layer. Second dielectric portion 208 has a U-shape. In some embodiments, second dielectric portion 208 has a shape different from a U-shape, such as a rectangular shape. In some embodiments where second dielectric portion 208 has a rectangular shape, conductive material 210 directly contacts spacers 214. A conductive material 210 is over at least a portion of second dielectric portion 208. In some instances, conductive material 210 is called a gate electrode. A gate capping layer 212 is over conductive material 210. Gate capping layer 212 also extends over a top of second dielectric portion 208 such that the gate capping layer directly contacts second dielectric portion 208. Spacers 214 adjoin sidewalls of gate structure 204 and contact a top surface of substrate 202. Spacers 214 contact first dielectric portion 206, second dielectric portion 208 and gate capping layer 212. Second dielectric portion 208 separates conductive material 210 from spacers 214.

In at least one embodiment, substrate 202 is a silicon substrate. In some embodiments, substrate 202 is a silicon on insulator (SOI) substrate, or a silicon on sapphire (SOS) substrate. In various embodiments, substrate 202 includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, substrate 202 includes a doped epitaxial layer, a gradient semiconductor layer, and/or further includes at least one organic material. In at least one embodiment, substrate 202 includes an active region and an isolation region, such as a shallow trench isolation (STI). As one example, the formation of the STI includes a photolithography process, an etch process to form a trench in substrate 202, and a deposition process to fill in the trench with one or more dielectric materials.

In at least one embodiment, gate structure 204 includes, for example, polysilicon, a metallic compound, a conductive alloy, a conductive polymer or another suitable gate material. In some embodiments, gate structure 204 is formed by a procedure including deposition, photolithography, and etch processes. In some embodiments, the deposition process includes chemical vapor deposition (CVD), physical vapor deposition (PVD), atomic layer deposition (ALD), other suitable processes, and/or combination thereof. In some embodiments, the photolithography process includes photoresist coating, soft baking, mask aligning, exposure, post-exposure baking, developing the photoresist, rinsing, and drying. In some embodiments, the etch process includes wet etching, dry etching, and/or other etching methods.

Gate structure 204 includes a multilayer structure. First dielectric portion 206 includes a first layer of silicon oxide, silicon nitride, silicon oxynitride, silicon carbide or another suitable insulating material. In at least one embodiment, first dielectric portion 206 is formed on a top surface of substrate 202 through a thermal oxidation method. In one or more embodiments, first dielectric portion 206 is deposited on the top surface of substrate 202. First dielectric portion 206 includes a second layer of a high dielectric constant (high-k) dielectric material in some embodiments. A high-k material includes materials having a dielectric constant higher than silicon dioxide, such as metal oxides, for example $HfO_2$ or $ZrO_2$. First dielectric portion 206 has a thickness ranging from about 5 Angstroms (Å) to about 30 Å, in some instances. If a thickness of first dielectric portion 206 is too small, then a large leakage current will be induced in the device, in some instances. If a thickness of first dielectric portion 206 is too large, then a short channel effect will occur, in some instances.

Second dielectric portion 208 includes a high-k dielectric material, in some instances. Second dielectric portion 208 includes a thickness of about 5 Å to about 30 Å, in some instances. If a thickness of second dielectric portion 208 is too thin, then a large leakage current will be induced in the device, in some instances. If a thickness of second dielectric portion 208 is too thick, then charge trapping will occur, in some instances. Second dielectric portion 208 is omitted in some embodiments. In some embodiments, first dielectric portion 206 and second dielectric portion 208 are a single material layer. For example, gate structure 204 includes an interfacial layer formed over substrate 202, and dielectric portion 206/208 formed over the interfacial layer. The interfacial layer is a silicon oxide layer formed by a thermal process or ALD process, in some instances.

Conductive material 210 is located within a cavity defined by second dielectric portion 208. Conductive material 210 is disposed directly on first dielectric portion 206, in some embodiments. In some embodiments, conductive material 210 is polysilicon. In some embodiments, conductive material 210 is tungsten. In some embodiments, conductive material 210 includes different materials such as titanium, nickel, or tantalum, and has a work function suitable for a p-type device or an n-type device.

Gate capping layer 212 includes a dielectric material. In some embodiments, gate capping layer 212 has a same material as at least one of first dielectric portion 206 or second dielectric portion 208. In some embodiments, gate capping layer 212 has a material different from both first dielectric portion 206 and second dielectric portion 208. Gate capping layer 212 protects conductive material 210 from being damaged during a subsequent contact etch process, in some instances. In some embodiments, during a later etch process, a degree of etching of gate capping layer 212 depends on the nature of the etchant species and the material of gate capping layer 212. For example, a contact structure is in contact with a silicide portion of the source or drain region, the spacers, and capping layer 212. The intended electrical connection is only made to the silicide portion of a source or drain region, so a tolerance for the contact misalignment is larger. In some embodiments, gate structure 204 is formed using a "gate-last" fabrication.

Spacers 214 are over the opposite sides of gate structure 204. Spacers 214 include a dielectric material such as silicon oxide, silicon nitride, silicon oxynitride, silicon carbide, or combinations thereof. In at least one embodiment, spacers 214 are called first gate spacers. In some embodiments, spacers 214 are also called offset spacers. In one or more embodiments, a thickness of each of spacers 214 from the sidewall of gate structure 204 is in a range from about 1 nanometer (nm) to about 50 nm to achieve the critical dimension in different processes. If a thickness of spacers 214 is too thin or too thick, then subsequent processes will be impacted, in some instances. In one or more embodiments, each of spacers 214 has a thickness in a range from about 1 nm to about 6 nm. If a thickness of spacers 214 is too thin or too thick, then a distribution of dopants in the source or drain region will be impacted, in some instances. In some embodiments, spacers 214 are formed by a procedure including deposition and etching back processes. In various embodiments, spacers 214 are patterned by performing an isotropic or an anisotropic etch process.

Returning to FIG. 1A, method 100A continues with operation 120 in which source/drain features are formed in the substrate at opposite sides of the gate structure. A portion of the substrate is removed to form recesses at an edge of each spacer. A filling process is then performed by filling the recesses in the substrate. In some embodiments, the recesses are etched, for example, a wet etching or a dry etching, after removal of a pad oxide layer or a sacrificial oxide layer. In some embodiments, the etch process is performed to remove a top surface portion of the active region adjacent to an isolation region, such as a shallow trench isolation (STI) region. In some embodiments, the filling process is performed by an epitaxy or epitaxial (epi) process. In some embodiments, the recesses are filled using a growth process which is concurrent with an etch process where a growth rate of the growth process is greater than an etch rate of the etch process. In some embodiments, the recesses are filled using a combination of growth process and etch process. For example, a layer of material is grown in the recess and then the grown material is subjected to an etch process to remove a portion of the material. Then a subsequent growth process is performed on the etched material until a desired thickness of the material in the recess is achieved. In some embodiments, the growth process continues until a top surface of the material is above the top surface of the substrate. In some embodiments, the growth process is continued until the top surface of the material is co-planar with the top surface of the substrate.

Figure 2B:
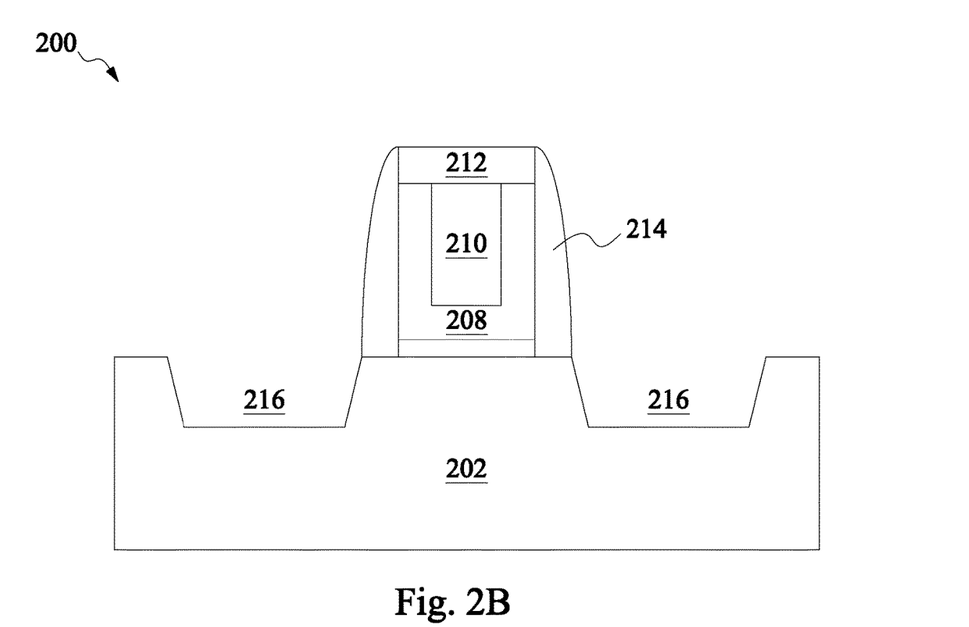

FIG. 2B is a cross-sectional view of semiconductor device 200 following formation of the recesses during operation 120 in accordance with one or more embodiments. Recesses 216 have a substantially trapezoidal shape in accordance with the etch process and/or the crystal structure of the substrate 202. Alternatively, recesses 216 have other shapes, such as rounded or elliptical shapes. A portion of substrate 202 is removed by an isotropic or an anisotropic etch process. The etch process selectively etches substrate 202 without etching gate structure 204 and spacers 214. In some embodiments, the etch process is performed using a reactive ion etch (RIE), wet etching, or other suitable techniques.

Figure 2C:
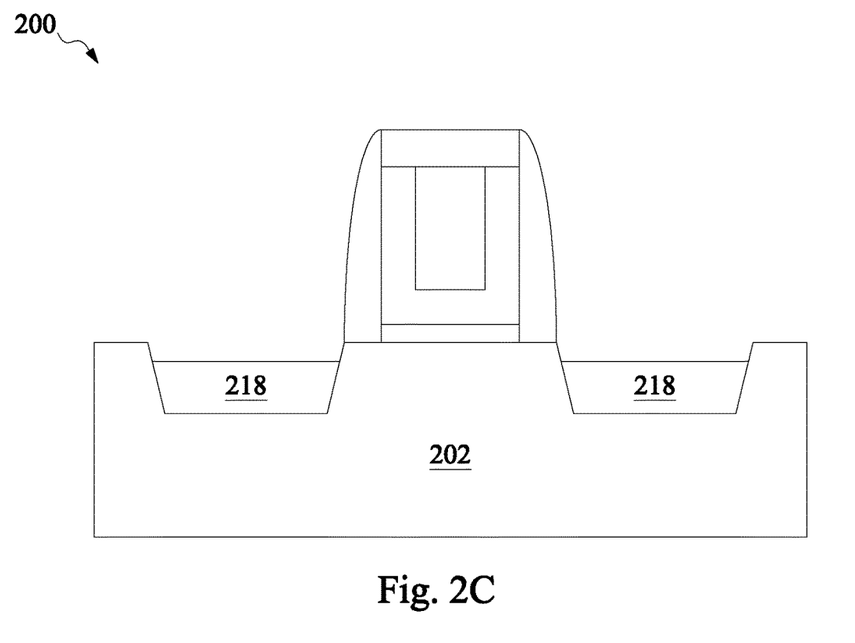

FIG. 2C is a cross-sectional view of semiconductor device 200 following operation 120 in accordance with one or more embodiments. A semiconductor material is deposited in recesses 216 to form the source/drain features 218. In some embodiments, a top surface of the source/drain features 218 is substantially co-planar with a bottom surface of gate structure 204. In some embodiments, the top surface of source/drain features 218 is above the top surface of substrate 202. In some embodiments, an epi process is performed to deposit the semiconductor material in recesses 216. In at least one embodiment, an amount of the semiconductor material in recesses 216 has a thickness less than an amount of the removed portion from substrate 202. In at least one embodiment, in order to prevent merging of the source/drain features, a top surface of the semiconductor material is about 3 nm to 10 nm lower than the top surface of substrate 202. In some embodiments, the epi process includes a selective epitaxy growth (SEG) process, CVD process, molecular beam epitaxy (MBE), other suitable processes, and/or combination thereof. The epi process uses gaseous and/or liquid precursors, which interacts with a composition of substrate 202. In some embodiments, source/drain features 218 include epitaxially grown silicon (epi Si), silicon carbide, or silicon germanium. Source/drain features 218 of semiconductor device 200 associated with gate structure 204 are in-situ doped or undoped during the epi process in some instances. When source/drain features 218 are undoped during the epi process, source/drain features 218 are doped during a subsequent process in some instances. The subsequent doping process is achieved by an ion implantation, plasma immersion ion implantation, gas and/or solid source diffusion, other suitable processes, and/or combination thereof. In some embodiments, source/drain features 218 are further exposed to annealing processes after forming source/drain features 218 and/or after the subsequent doping process.

Returning to FIG. 1A, method 100A continues with operation 130 in which an etch stop layer (ESL) is deposited on the gate structure, the spacers, and the source/drain features. In some embodiments, the ESL includes a same material as the spacers. In some embodiments, the ESL includes a different material from the spacers. In some embodiments, one or more additional features is formed interposing the spacers and the ESL. In some embodiments, the ESL is formed by depositing a dielectric material and anisotropically etching back the dielectric material to form a spacer shape, or a D shape.

Figure 2D:
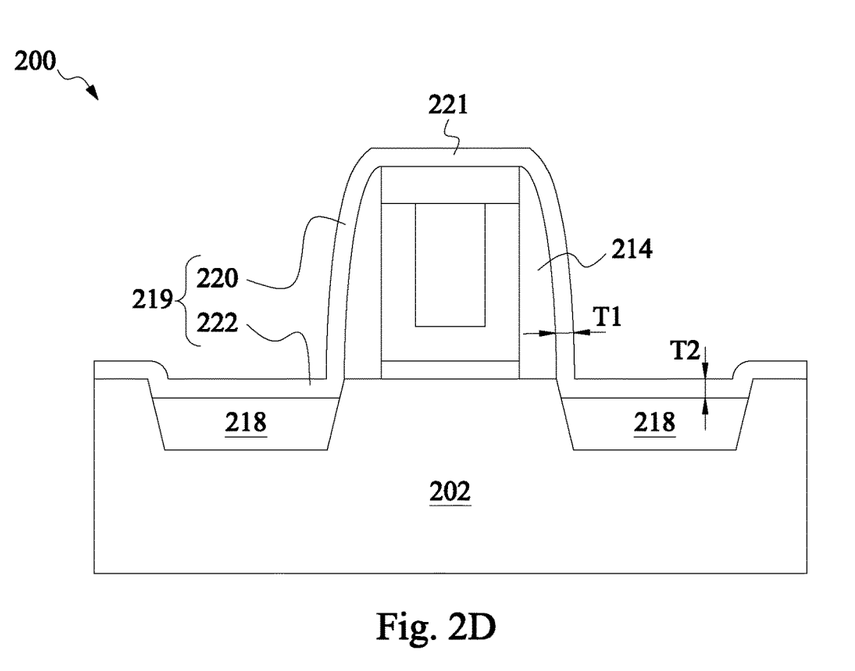

FIG. 2D is a cross-sectional view of semiconductor device 200 following operation 130 in accordance with one or more embodiments. In some embodiments, ESL 219 fills a void between spacers 214 and source/drain features 218. ESL 219 includes an upper portion 220 along spacers 214 and farther from substrate 202 and a lower portion 222 along source/drain features 218 and closer to substrate 202. In some embodiments, upper portion 220 of ESL 219 is also called a second gate spacer. In some embodiments, lower portion 222 of ESL 219 is also called a bottom etch stop layer. Examples of materials which is usable to form ESL 219 include silicon nitride, silicon oxide, silicon oxynitride, silicon carbide, other suitable materials, and/or combination thereof. In some embodiments, ESL 219 is formed by CVD process, PVD process, ALD process, molecular layer deposition (MLD), other suitable processes, and/or combination thereof.

In at least one embodiment, operation 130 includes one or more cycles of a deposition-etch-deposition (DED) procedure until a desired thickness T1 of upper portion 220 of ESL 219 is reached. The multiple cycles of deposition and etch processes may have the same or different process parameters. Desired thickness T1 includes a thickness of about 1 nm to about 5 nm. If desired thickness T1 is too thin or too thick, then a distribution of dopants in source/drain features 218 will be impacted, in some instances. The first deposition process of the DED procedure forms upper portion 220 abutting spacers 214 and a top portion 221 on gate structure 204, and a second portion on source/drain features 218. In some embodiments, the first deposition is formed by the thermal oxidation method. The etch process of the DED procedure removes the second portion while at least a portion of upper portion 220 remains on sidewalls of spacers 214 and forms a spacer shape in some instances. The second deposition process of the DED procedure forms lower portion 222 until a desired thickness T2 of lower portion 222 is reached. Desired thickness T2 includes a thickness of about 1 nm to about 5 nm. If desired thickness T2 is too thin, for example, the functionality of being an etch stop layer will fail. If the thickness T2 is too thick, a risk of unintended etch-induced damage will increase, in some instances.

Returning to FIGS. 1A, method 100A continues with operation 140 in which a dielectric layer is deposited over the top of the gate structure overlying the ESL. In some embodiments, the dielectric layer is called an inter-layer dielectric (ILD) layer. In some embodiments, the dielectric layer is deposited by CVD, PVD, ALD, a high density plasma (HDP), spin-on-dielectric process, other suitable processes, and/or combination thereof.

Figure 2E:
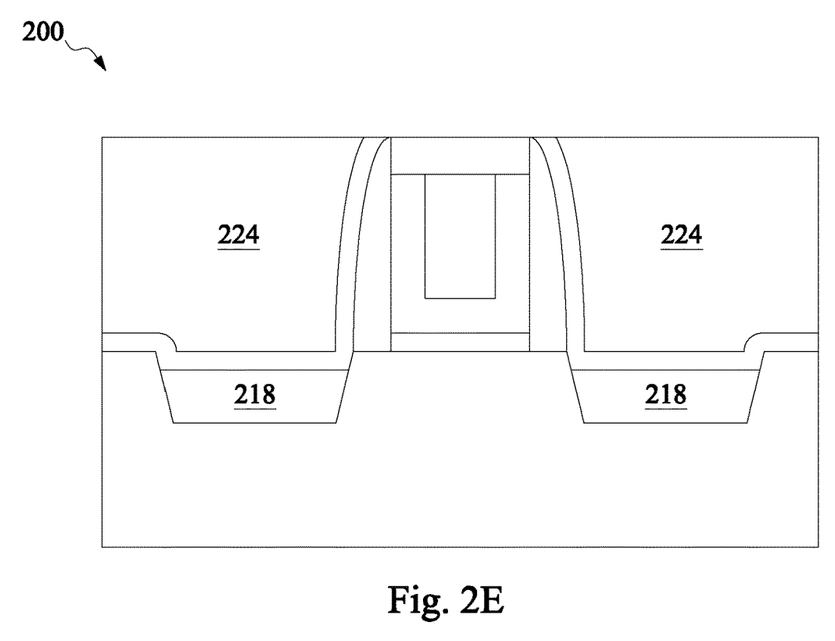

FIG. 2E is a cross-sectional view of semiconductor device 200 following operation 140 in accordance with one or more embodiments. An inter-layer dielectric (ILD) 224 is deposited over top portion 221, upper portion 220 and lower portion 222 of ESL 219. ILD 224 fills in the gaps between gate structure 204 and adjacent gate structures. In some embodiments, ILD 224 includes an insulating material such as silicon oxide, silicon nitride, undoped silicate glass (USG), Boro-Silicate Glass (BSG), a low-k material, TEOS, other suitable materials, and/or combination thereof. In some embodiments, ILD 224 is planarized to be coplanar with a top surface of gate structure 204. For example, ILD 224 is planarized by using a chemical mechanical planarization (CMP) to remove portions of ILD 224 in some embodiments. The CMP is applied to remove top portion 221 of ELS 219 to expose gate capping layer 212 of gate structure 204. In various embodiments, other planarization techniques are used, such as an etch process. After the planarization process is performed, gate capping layer 212 remains over conductive material 210 and between spacers 214. ILD 224 has a thickness from about 50 nm to about 120 nm in some instances. If a thickness of ILD 224 is too thick, a contact profile will be difficult to maintained, in some instances. If a thickness of ILD 224 is too thin, gate structure 204 will be damaged during the planarization process, in some instances. In a "gate-last" fabrication process, a dummy dielectric and/or a dummy gate structure is initially formed and is followed by a CMOS process flow until the deposition of ILD 224.

Returning to FIGS. 1A, method 100A continues with operation 150 in which an atomic layer etching (ALE) process is performed to etch openings in the dielectric layer and the ESL to expose the source/drain features. The openings are defined by a photolithography process. The ALE process is capable of a selective surface etch process with high selectivity. In some embodiments, ALE process includes an absorption process and a bombardment process. In the absorption process, an etchant, for example, radicals, molecules, or plasma-assisted organic compound, is disposed over a top layer of a surface of a material to be etched. The etchant interacts with surface atoms of the material to be etched. The interaction with the etchant weakens a bonding between the interacted surface atoms and atoms thereunder. In the bombardment process, a charged ion is then guided toward the etchant and the interacted surface atoms in order to break the weakened bonding between the interacted surface atoms and the underlying atoms of the material to be etched. In some embodiments, the absorption process and the bombardment process are performed in repeated cycles until a predetermined thickness of the material is removed. During the ALE process, for example, in order to avoid unintentionally damaging other material, such as the source/drain features, the removal of the material to be etched is controlled in a layer-by-layer procedure. The ALE process includes at least two different operating parameters in some instances. In some embodiments, the parameter is a bias associated with a stage and a bias generator. In some embodiments, the parameter is an energy of the ion released from an implanter. In some embodiments, a high implantation energy in combination with a low bias has a similar speed as a low implantation energy in combination with a high bias.

Figure 1B:
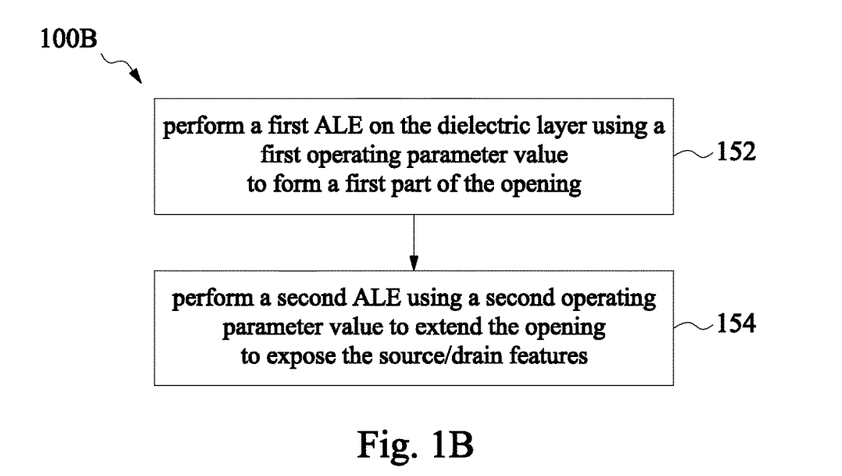
FIG. 1B is a flowchart of a method of forming the opening by performing an ALE process in accordance with one or more embodiments.

FIG. 1B is a flowchart of a method 100B of forming the opening by performing an ALE process according to one or more embodiments. In some embodiments, the opening is a contact opening for a contact structure. In some embodiments, the opening is for a conductive via. In one or more embodiments, a monolayer etching is achieved by a self-limiting mechanism based on the nature of the ALE process. In some embodiments, a multiple-layer etch process in accordance with time and plasma condition of the absorption process is achieved by some etchant species such as fluorocarbon (FC). In at least one embodiment, this multiple-layer etch process using ALE is also called a "quasi-ALE" process.

Method 100B includes operation 152 in which a first ALE process is performed on the dielectric layer using a first operating parameter value to form a part of the opening. In some embodiments, the first operating parameter value defines a value of a bias associated with a stage and a bias generator. In some embodiments, the first operating parameter value defines a value of an energy of the ion used to bombard the etchant and the interacted atoms of the ILD. The formation of the opening further includes patterning the ILD by a photolithography process (e.g., patterning a hard mask layer), and then performing an ALE process having the first operating parameter value. The opening is formed between the gate structure and adjacent semiconductor devices in some embodiments.

Figure 2F:
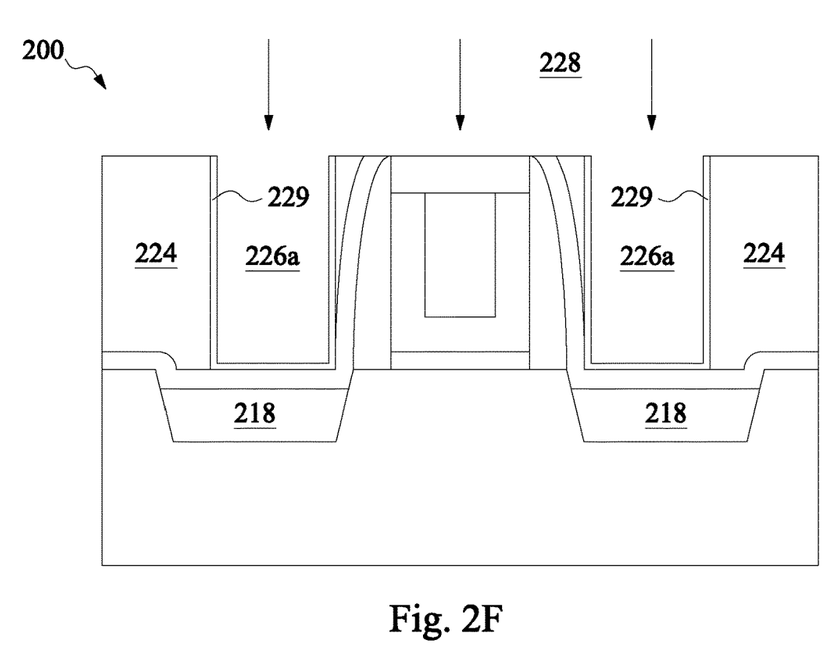

FIGS. 2F is a cross-sectional view of semiconductor device 200 following operation 152 in accordance with one or more embodiments. A contact opening 226a is formed by a first ALE process 228 through ILD 224 and through at least a portion of lower portion 222 of ESL 219. In some embodiments, the first ALE process 228 exposes a portion of the source/drain features 218. The first ALE process 228 is performed in an atomic scale dimension, in some instances.

The first ALE process 228 is performed in cycles to form a first part of the contact opening 226a. In some embodiments, the first ALE process 228 is also called a main-etch process. The first ALE process 228 prevents upper portion 220 of ESL 219 and gate capping layer 212 from being damaged during the main-etch process. The first ALE process 228 prevents damage to the source/drain features 218 during the main-etch process, in some instances. The formation of the contact opening 226b includes a self-alignment contact (SAC) process, in some instances. In some embodiments, the SAC process includes a selective etch process. The selective etch process removes a portion of ILD 224 over source/drain features 218, a portion of spacers 214, and/or a portion of gate capping layer 212 while keeps a portion of spacers 214 and gate capping layer 212, for example. In some embodiments, upper portion 220 of ESL 219 is partially exposed during the first ALE process 228. In some embodiments, the first ALE process 228 is an anisotropic etch process or an isotropic etch process. In some embodiments, an etch rate of the first ALE process 228 ranges from about 5 Å to about 20 Å per cycle. If the etch rate of the first ALE process 228 is too low, then manufacturing time is unnecessarily increased, in some instances. If the etch rate of the first ALE process 228 is too high, then a risk of damaging the source/drain features 218 or other structures within semiconductor device 200 are increased in some instances. Alternatively, the etch rate includes other values usable to achieve the critical dimension in different processes.

During the first ALE process 228, an etchant precursor 229 is formed by exposing ILD 224 to an etchant gas. In some embodiments, the etchant gas is a halogen gas such as $Cl_2$, $F_2$, or organofluorine compounds such as $CHF_3$, $C_4F_8$. In some embodiments, the etchant gas is ionized to generate reactive ions. In some embodiments, the etchant gas is ionized using a plasma-assisted process. In some embodiments, the etchant precursor 229 is formed along the top surface of an exposed portion of ILD 224 and/or lining sidewall surfaces of opening 226a in ILD 224. The top surface of the exposed portion of ILD 224 includes several atoms which interact with the etchant gas and form etchant precursor 229. In some embodiments, etchant precursor 229 includes a single compound. In some embodiments, etchant precursor 229 includes multiple compounds. Etchant precursor 229 changes a bonding energy between the several atoms and underlying material of ILD 224. An implanter (not shown) then accelerates an ion to bombard etchant precursor 229. In some embodiments, the ion is an argon ion ($Ar^+$), a hydrogen ion ($H^+$) or a nitrogen ion ($N^+$). In at least one embodiment, the ion is part of an $Ar^+$ beam. The ion bombardment removes etchant precursor 229 including the portions of ILD 224 which formed etchant precursor 229.

An energy distribution of the charged particles included in the $Ar^+$ beam is a normal (or Gaussian) distribution in some instances. In addition to decrease a damage to gate capping layer 212, to prevent an exposed surface of upper portion 220 of ESL 219 from being damaged and resulting in spacer loss, the first ALE process 228 uses a relatively low value for the first operating parameter value. In some embodiments where the first operating parameter value is an energy of the ion, the first operating parameter value of the first ALE process 228 is controlled such that the ion is emitted with an electron voltage (eV) energy ranging from tens of eV to hundreds of eV. Considering both an etch efficiency of the first ALE process 228 and protection of upper portion 220 of ESL 219 and gate capping layer 212, in at least one embodiment, the ion is accelerated toward etchant precursor 229 with an energy from about 10 eV to about 500 eV. A higher energy or a lower energy would impact the time control in view of the etchant gas dispatch and the ion bombardment. In some embodiments the first ALE process 228 is performed repeatedly, i.e., in multiple cycles, until source/drain features 218 are completely exposed. In some embodiments, the first ALE process 228 is performed repeatedly until a target thickness of lower portion 222 above the source/drain features 218 is achieved.

Returning to FIG. 1B, method 100B continues with operation 154 in which a second ALE is performed having a second operating parameter value to remove a residue remaining on the ESL. Interconnections formed through contact structures exhibits an increased resistance to the flow of electric current due to the residue between the contact structures and the source/drain features. In order to prevent an increase of a contact resistance and/or a decrease of the current in the channel region, the second ALE process is performed to remove residue of the lower portion of the ESL. In some embodiments, the second ALE process includes multiple etching cycles. In some embodiments, the second ALE process results in over-etching of the ESL or the ILD.

Figure 2G:
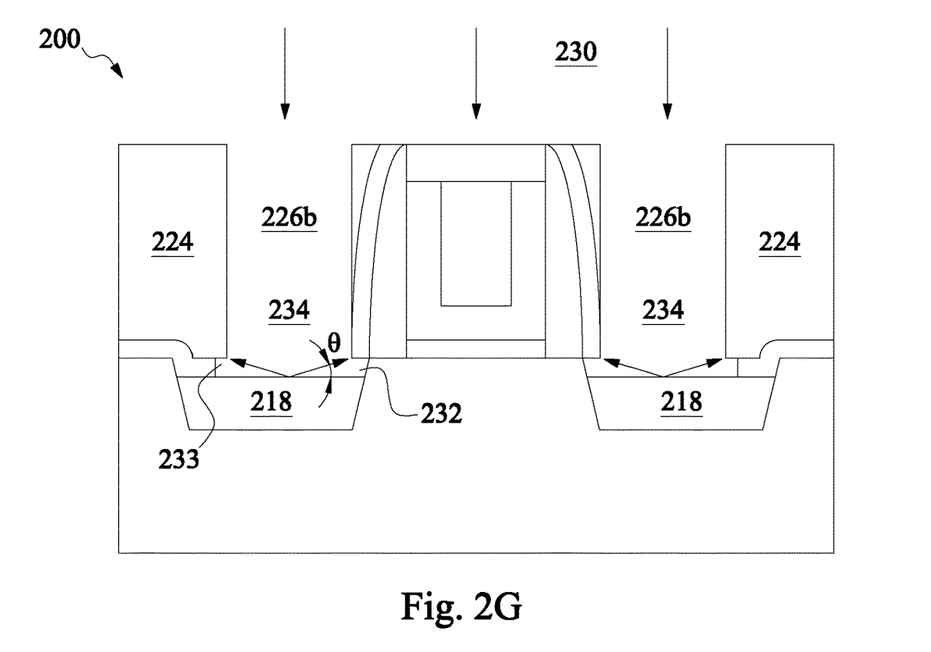

A second ALE process 230 is used to completely remove lower portion 222 of ESL 219 in a contact opening 226b. The second ALE process 230 includes the same basic operations as the first ALE process 228, i.e., formation of an etchant precursor followed by ion bombardment of the etchant precursor. In some embodiments, a species of the etchant gas used to form the etchant precursor for the second ALE process 230 is a same species as that used to form the etchant precursor for the first ALE process 228. In some embodiments, the species of the etchant gas used to form the etchant precursor for the second ALE process 230 is different from the species used to form the etchant precursor for the first ALE process 228. In some embodiments, a species of the ion used to bombard the etchant precursor for the second ALE process 230 is a same species as that used to bombard the etchant precursor for the first ALE process 228. In some embodiments, the species of the ion used to bombard the etchant precursor for the second ALE process 230 is different from the species used to bombard the etchant precursor for the first ALE process 228.

FIG. 2G is a cross-sectional view of semiconductor device 200 following operation 154 in accordance with one or more embodiments. The second ALE process 230 is operated having a second operating parameter value which is greater than the first operating parameter value. The second operating parameter value and the first operating parameter value relate to a same operating parameter in the second ALE process 230 and the first ALE process 228, respectively. In various embodiments, the first operating parameter value and the second operating parameter value is controlled by a combination of an energy of the ion and the bias associated with the stage and the bias generator. In some embodiments, an impact energy of the ion used in the second ALE process 230 is sufficiently high to result in backscattering ions 234, indicated as arrows in FIG. 2G. In some embodiments, the Ar$^+$ beam is emitted with an eV energy ranges hundreds of eV to thousands of eV. In at least one embodiment, the Ar$^+$ beam is accelerated with an energy from about 100 eV to about 5000 eV.

In some embodiments, the second ALE process 230 continues until source/drain features 218 are exposed and a first corner 232 under upper portion 220 of ESL 219 is free of residue. Because backscattering ions 234 bombard symmetrically at either side of contact opening 226b, a second corner 233 under ILD 224 on the opposite of first corner 232 is free of residue, in some instances. In some embodiments, lower portion 222 of ESL 219 between upper portion 220 and the source/drain features 218 is completely removed by the second ALE process 230. An etch rate of the second ALE process 230 ranges from about 1 Å to about 10 Å per cycle, in some instances. If the etch rate of the second ALE process 230 is too fast, upper portion 220 of the ESL 219 will be damaged and reduce an effective channel length, in some instances. If the etch rate of the second ALE process 230 is too slow, the second ALE process 230 will lack sufficient energy to result in backscattering ions 234.

A shape of contact opening 226b is the result of removing residue at first corner 232 and second corner 233. First corner 232 is between upper portion 220 of ESL 219 and the top surface of source/drain features 218. Second corner 233 is between ILD 224 and lower portion 222 of ESL 219. An angle θ of backscattering ions 234 relative to the top surface of source/drain features 218 ranges from greater than 0 degrees to about 45 degrees, which is adjustable based on an energy of the ion impacting the etchant precursor. If angle θ of backscattering ions 234 is too great, the residue remains at first corner 232 will not be completely removed, in some instances. If angle θ of backscattering ions 234 is too small, a risk of unintended etch-induced damage will increase, in some instances. In some embodiments, contact opening 226b has a tapered profile. In some embodiments, contact opening 226b is formed by an ALE process as the main etch process and a RIE process as the over etch process. In some embodiments, multiple ion bombardments can be performed with different operating parameter values.

Figure 2H:
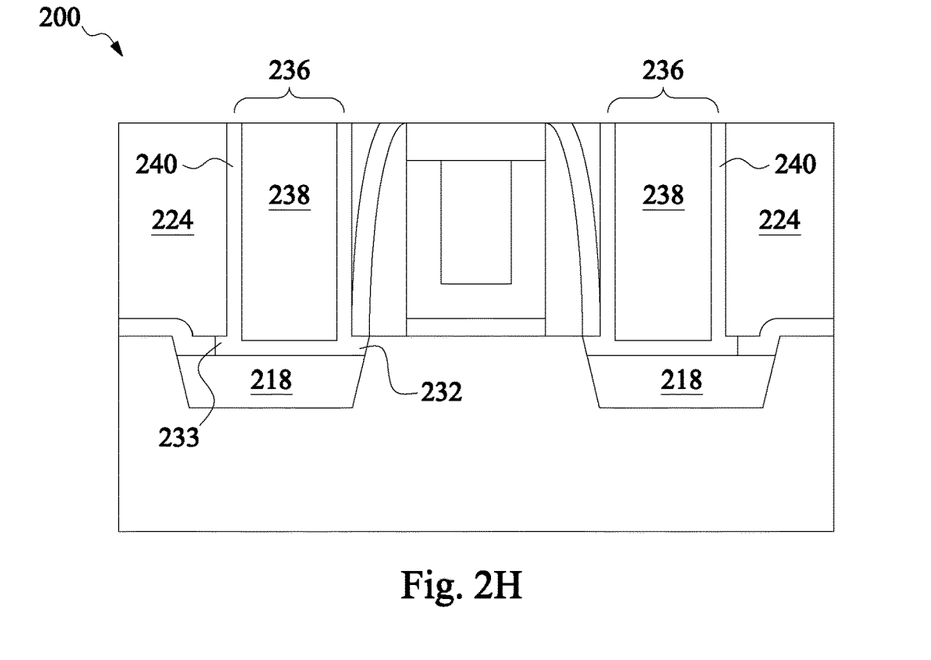

FIG. 2H is a cross-sectional view of semiconductor device 200 in accordance with one or more embodiments. Semiconductor device 200 includes gate structure 204, source/drain features 218, ESL 219, and ILD 224. A contact structure 236 extends through ILD 224 and fills contact opening 226b. In some embodiments, contact structure 236 includes a contact plug 238 and a liner 240. Contact plug 238 is laterally surrounded by liner 240. Liner 240 is deposited in contact opening 226b before the fabrication of contact plug 238. In some embodiments, liner 240 is formed using CVD or other suitable processes, and/or combination thereof. One or more films are formed between contact opening 226b and contact structure 236 in some instances. In one or more embodiments, liner 240 is formed of titanium nitride, tungsten nitride, suitable nitride, or other materials. An outermost sidewall of contact structure 236 directly contacts source/drain features 218 without the residue of lower portion 222 of ESL 219 at first corner 232. In some embodiments, liner 240 fills first corner 232 and second 233 so that a diameter of a bottom portion of contact structure 236 is greater than a diameter of a body portion of contact structure 236. Contact structure 236 electrically connects to source/drain features 218. For example, contact structure 236 electrically connects to the silicide formed on the top surface of source/drain features 218. In some embodiments, contact structure 236 is coupled to another device or component of substrate 202.

Semiconductor device 200 may undergo further processing to complete fabrication. For example, a not-illustrated multilayer interconnection (MLI) including metal layers (e.g., M1, M2, etc.) and inter-metal dielectric (IMD) layers are formed above gate structure 204 in order to electrically couple various device parts to form an integrated circuit. The multilayer interconnection includes vertical interconnects, such as conventional vias or contact structures, and horizontal interconnects, such as metal lines. In some embodiment, the various interconnection features utilize various conductive materials including copper, tungsten and silicide. In some embodiments, a damascene process is used to form copper multilayer interconnection structure.

Figure 3A:
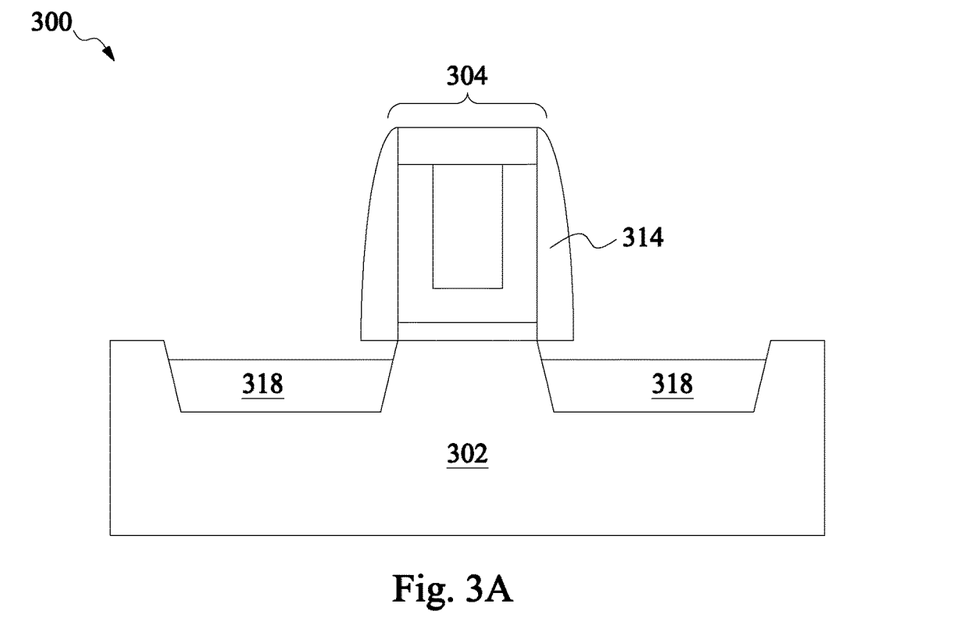
FIGS. 3A-3B are cross-sectional views of another semiconductor device having a contact opening at various stages of production in accordance with one or more embodiments.
Figure 3B:
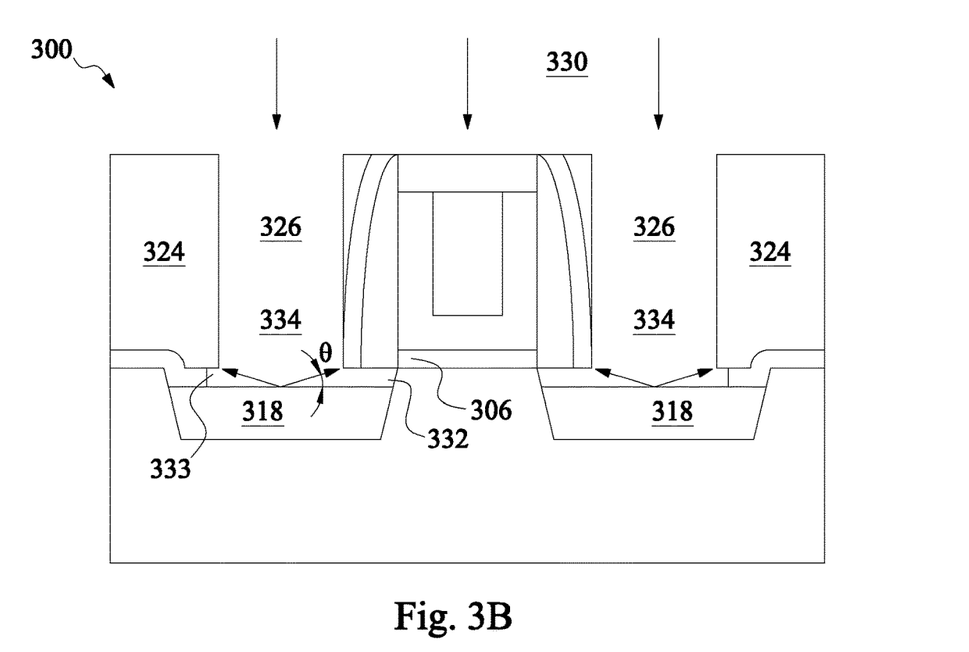

FIGS. 3A to 3B are cross-sectional views of semiconductor device 300 in accordance with one or more embodiments. Semiconductor device 300 is similar to semiconductor device 200, like elements have a same reference number increased by 100. In contrast with semiconductor device 200, a bottom surface of spacers 314 do not contact substrate 302 of semiconductor device 300. Semiconductor device 300 also includes a first corner 332 and a second corner 333. First corner 332 and second corner 333 are on opposite sides in a contact opening 326. As shown in FIG. 3B, recesses 316 includes a substantially trapezoidal shape in accordance with the etch process and/or the crystal structure of the substrate 302, for example. Alternatively, the recesses 316 includes other shapes, such as rounded or elliptical. Compared with semiconductor device 200, the etch process of recesses 316 is selected to achieve a "proximity push" or a close proximity to semiconductor device 300 comprising a channel region under a first dielectric portion 306. Contact opening 326 is formed by a first ALE process through an ILD 324 and through at least a portion of lower portion of an ESL. A second ALE process 330 is used to completely remove lower portion of ESL in contact opening 326. In some embodiments, an impact energy of the ion used in the second ALE process 330 is sufficiently high to result in backscattering ions 334, indicated as arrows in FIG. 3B. In some embodiments, the $Ar^+$ beam is emitted with an eV energy ranges hundreds of eV to thousands of eV. In some embodiments, the second ALE process 330 continues until source/drain features 318 are exposed and a first corner 332 under upper portion of ESL is free of residue.

Figure 4:
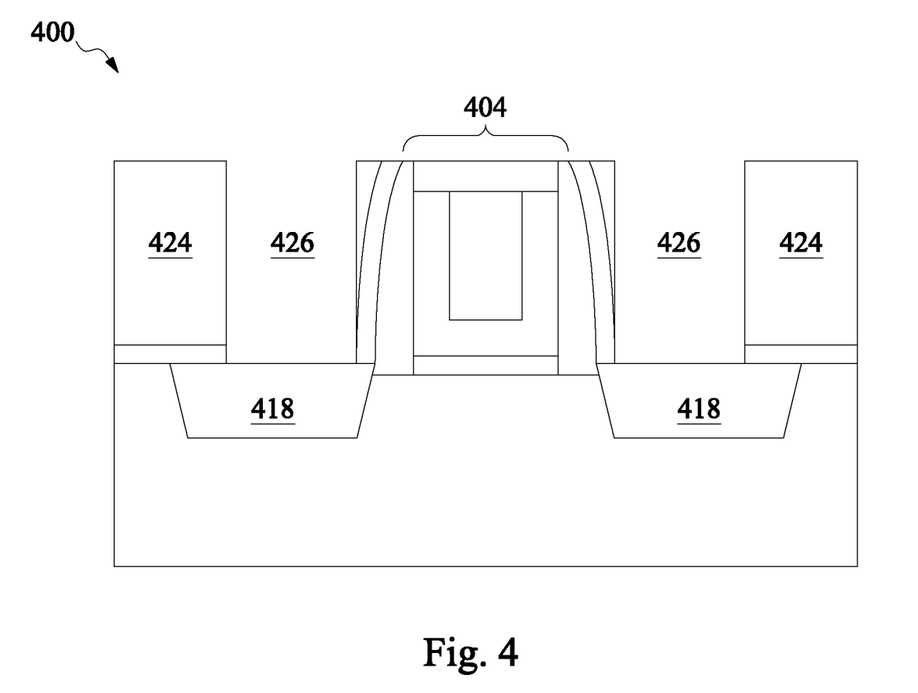
FIG. 4 is a cross-sectional view of a semiconductor device in accordance with one or more embodiments.

FIG. 4 is a cross-sectional view of semiconductor device 400 in accordance with one or more embodiments. Semiconductor device 400 is similar to semiconductor device 200, like elements have a same reference number increased by 200. In contrast with semiconductor device 200, a semiconductor material deposited in recesses 416 to form source/drain features 418 extends above a top surface of substrate 402. Source/drain features 418 are alternatively referred to as raised source and drain features. A contact opening 426 is formed by a first ALE process through an ILD 424 and through at least a portion of lower portion of an ESL. A second ALE process 430 is used to completely remove lower portion of ESL in contact opening 426. In some embodiments, an impact energy of the ion used in the second ALE process 430 is sufficiently high to result in backscattering ions. In some embodiments, the second ALE process includes an $Ar^+$ beam emitted with an eV energy ranges hundreds of eV to thousands of eV. In some embodiments, the second ALE process 430 continues until source/drain features 418 are exposed and a portion under upper portion of ESL is free of residue.

One aspect of this description relates to a method of fabricating a semiconductor device. The method includes forming source/drain features in a substrate on opposite sides of a gate structure, forming an etch stop layer over the source/drain features, and depositing a dielectric layer on the etch stop layer. The method further includes performing a first atomic layer etching (ALE) process having a first operating parameter value on the dielectric layer to form a first part of an opening, and performing a second ALE process having a second operating parameter value to extend the opening to expose source/drain features. The first operating parameter value is different from the second operating parameter value.

Another aspect of this description relates to a method of fabricating a field effect transistor. The method includes forming source/drain features in a substrate on opposite sides of a gate structure, forming an etch stop layer (ESL) over the source/drain features. The ESL comprises an upper portion apart from the substrate and a lower portion close to the substrate. The method includes depositing an inter-layer dielectric (ILD) layer on the ESL. The method further includes performing a first atomic layer etching (ALE) process through the ILD layer to form an opening until the source/drain features are exposed, and performing a second ALE process having sufficient energy to cause a backscattering of bombarded ions to remove residual of the lower portion of the ESL remaining after the first ALE process.

Still another aspect of this description relates to a fin field effect transistor (FinFET) device. The FinFET device includes a gate structure on a substrate, spacers on opposite sidewalls of the gate structure, and source/drain features in the substrate. A top surface of the source/drain features is lower than a top surface of the substrate. The FinFET further includes an etch stop layer having an upper portion overlying the spacers and a lower portion on the source/drain features, a dielectric layer over the etch stop layer, and a contact structure. The contact structure extending through the dielectric layer to contact the source/drain features. The outermost sidewall of the contact structure directly contacts the source/drain features without the etch stop layer between the contact structure and the source/drain features and a diameter of a bottom portion of the contact structure is greater than a diameter of a body portion of the contact structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, operations, and steps described in the specification. As one of ordinary skill in the art will readily appreciate from the disclosure, processes, machines, manufacture, compositions of matter, means, methods, operations, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, operations, or steps. In addition, each claim constitutes a separate embodiment, and the combination of various claims and embodiments are within the scope of the disclosure.

What is claimed is:

1. A method of fabricating a semiconductor device, the method comprising:

forming source/drain features in a substrate on opposite sides of a gate structure;
forming an etch stop layer directly over the source/drain features, wherein the etch stop layer comprises an insulating material;
depositing a dielectric layer on the etch stop layer;
performing a first atomic layer etching (ALE) process having a first operating parameter value on the dielectric layer to form a first part of an opening; and
performing a second ALE process having a second operating parameter value on the etch stop layer to extend the opening in a direction parallel to a top surface of the substrate and to expose the source/drain features, wherein the first operating parameter value is different from the second operating parameter value, and the performing of the second ALE process comprises maintaining a portion of the etch stop layer.

2. The method of claim 1, wherein performing the first ALE process comprises forming an etchant precursor along a top surface of an exposed portion of the dielectric layer and lining sidewall surfaces of the opening in the dielectric layer.

3. The method of claim 2, wherein the first operating parameter value comprises a first energy of an ion impacting the enchant precursor ranging from tens of electron volts (eV) to hundreds of eV.

4. The method of claim 1, wherein performing the second ALE process comprises forming an etchant precursor overlying a top surface of a portion of the etch stop layer closer to the substrate.

5. The method of claim 4, wherein the second operating parameter value comprises a second energy of an ion impacting the etchant precursor ranging from hundreds of eV to thousands of eV.

6. The method of claim 4, wherein performing the second ALE process comprises bombarding the etchant precursor with sufficient energy to cause backscattering of ions.

7. The method of claim 6, wherein an angle of the backscattering of the ions relative to a top surface of the source/drain features ranges from greater than 0 degrees to about 45 degrees.

8. The method of claim 1, wherein forming the source/drain features in the substrate comprises forming recesses in the substrate and epitaxially growing a semiconductor material in the recesses, wherein a top surface of the semiconductor material is lower than a top surface of the substrate.

9. The method of claim 8, wherein forming the recesses in the substrate comprises extending the recesses under spacers adjoining sidewalls of the gate structure.

10. The method of claim 1, wherein forming the source/drain features in the substrate comprises forming a recess in the substrate and epitaxially growing a semiconductor material in the recess, wherein a top surface of the semiconductor material is higher than a top surface of the substrate.

11. A method of fabricating a field effect transistor, the method comprising:
forming source/drain features in a substrate on opposite sides of a gate structure;
forming an etch stop layer (ESL) directly over the source/drain features, wherein the ESL comprises an upper portion apart from the substrate and a lower portion close to the substrate, and wherein the ESL layer comprises an insulating material;
depositing an inter-layer dielectric (ILD) layer on the ESL;
performing a first atomic layer etching (ALE) process through the ILD layer to form an opening until the source/drain features are exposed; and
performing a second ALE process having sufficient energy to cause a backscattering of bombarded ions on the ESL, partially removing residual of the lower portion of the ESL remaining after the first ALE process, wherein the performing of the second ALE process comprises removing a portion of the ESL between the ILD layer and the source/drain features.

12. The method of claim 11, wherein forming the ESL comprises:
depositing a first portion of the ESL on the source/drain features and a second portion of the ESL over the gate structure, wherein the second portion of the ESL is the upper portion of the ESL;
etching the first portion of the ESL to expose the source/drain features; and
depositing the lower portion of the ESL over the source/drain features.

13. The method of claim 12, wherein depositing the lower portion of the ESL comprises a second thickness ranging from about 1 nm to about 5 nm.

14. The method of claim 11, wherein forming the source/drain features comprises extending recesses in the substrate to a distance under the upper portion of the ESL.

15. The method of claim 11, wherein performing the second ALE process comprise:
dispatching an etchant gas on an exposed portion of the lower portion of the ESL;
forming an etchant precursor by interactions between the etchant gas and a reactive surface of the ESL; and
accelerating an ion on the reactive surface to remove the etchant precursor.

16. The method of claim 11, wherein performing the first ALE process comprises using a first energy ranging from tens of electron volts (eV) to hundreds of eV, and an etch rate of the first ALE process ranging from about 5 Angstroms (Å) to about 20 Å per cycle.

17. The method of claim 11, wherein performing the second ALE process comprises using a second energy ranging from hundreds eV to thousands eV, and an etch rate of the second ALE process ranging from about 1 Å to about 10 Å per cycle.

18. The method of claim 11, wherein an angle of the backscattering of the bombarded ions relative to a top surface of the source/drain features ranges from greater than 0 degrees to about 45 degrees.

19. The method of claim 11, wherein forming the source/drain features in the substrate comprises forming recesses in the substrate and epitaxially growing a semiconductor material in the recesses, wherein a top surface of the semiconductor material is lower than a top surface of the substrate.

20. A method of manufacturing a semiconductor structure, the method comprising:
depositing a source/drain feature adjoining a gate structure;
forming a spacer along a sidewall of the gate structure;
depositing an etch stop layer directly and continuously over the source/drain feature and along the spacer, wherein the etch stop layer comprises an insulating material;
depositing a dielectric layer over the etch stop layer;
performing a first atomic layer etching (ALE) process through the dielectric layer to form an opening exposing a portion of the source/drain feature; and
performing a second ALE process to enlarge a diameter of a bottom portion of the opening, wherein the performing of the second ALE process comprises etching the etch stop layer to define a sidewall of the etch stop layer recess from a sidewall of the opening in the dielectric layer.

* * * * *